US008832607B2

(12) United States Patent
Koike et al.

(10) Patent No.: US 8,832,607 B2
(45) Date of Patent: Sep. 9, 2014

(54) METHOD FOR MAKING CORRECTION MAP OF DOSE AMOUNT, EXPOSURE METHOD, AND METHOD FOR MANUFACTURING SEMICONDUCTOR DEVICE

(75) Inventors: Takashi Koike, Mie-ken (JP); Hiroyuki Mizuno, Mie-ken (JP); Yosuke Okamoto, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/598,736

(22) Filed: Aug. 30, 2012

(65) Prior Publication Data

US 2013/0252176 A1 Sep. 26, 2013

(30) Foreign Application Priority Data

Mar. 22, 2012 (JP) ................................. 2012-065750

(51) Int. Cl.
G06F 17/50 (2006.01)
G03F 1/00 (2012.01)
G03F 7/20 (2006.01)

(52) U.S. Cl.
CPC .............. *G03F 1/144* (2013.01); *G03F 7/2002* (2013.01); *G06F 17/5068* (2013.01); *G06F 17/5081* (2013.01); *G03F 7/705* (2013.01); *G03F 7/70558* (2013.01); *G03F 7/70941* (2013.01)
USPC ........................................... 716/51; 430/319

(58) Field of Classification Search
CPC . G06F 17/5068; G06F 17/5081; G03F 1/144; G03F 7/2002
USPC ..................... 716/51; 430/315, 319
See application file for complete search history.

(56) References Cited

U.S. PATENT DOCUMENTS

| 8,068,212 B2 * | 11/2011 | Van De Kerkhof et al. .... 355/68 |
| 2005/0075819 A1 | 4/2005 | Paxton et al. |
| 2008/0311486 A1 | 12/2008 | Itoh |
| 2010/0002209 A1 * | 1/2010 | Kawashima et al. ........... 355/52 |
| 2010/0285409 A1 * | 11/2010 | Tanaka .......................... 430/315 |
| 2011/0216301 A1 * | 9/2011 | De Lange et al. ............... 355/72 |
| 2013/0185681 A1 * | 7/2013 | Liu et al. .......................... 716/51 |

FOREIGN PATENT DOCUMENTS

| JP | 2000-235945 A | 8/2000 |
| JP | 2005-94015 | 4/2005 |
| JP | 2005-116810 A | 4/2005 |
| JP | 2007-234716 | 9/2007 |
| JP | 2008-192845 | 8/2008 |

OTHER PUBLICATIONS

Office Action issued Jun. 19, 2014 to Japanese Patent Application No. 2012-065750, with English translation.

* cited by examiner

*Primary Examiner* — Vuthe Siek
(74) *Attorney, Agent, or Firm* — Oblon, Spivak, McClelland, Maier & Neustadt, L.L.P.

(57) ABSTRACT

According to one embodiment, a method for making a correction map of a dose amount of EUV light used when exposing with the EUV light, includes estimating an exposure result based on an initial correction map of the dose amount and flare of the EUV light, determining a goodness of the exposure result, and correcting the initial correction map in the case where the exposure result is unacceptable. And, the correcting of the initial correction map, the estimating of the exposure result, and the determining of the goodness are repeated until the exposure result is good.

15 Claims, 10 Drawing Sheets

METHOD FOR MAKING CORRECTION MAP OF DOSE AMOUNT, EXPOSURE METHOD, AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2012-065750, filed on Mar. 22, 2012; the entire contents of which are incorporated herein by reference.

FIELD

Embodiments described herein relate generally to a method for making a correction map of dose amount, an exposure method, and a method for manufacturing a semiconductor device.

BACKGROUND

With the downscaling of semiconductor devices in recent years, lithography using EUV (Extreme UltraViolet) light which has a shorter wavelength is considered instead of conventional lithography using ArF light. However, flare (scattered light) of the exposure using the EUV light undesirably is exceedingly high. As a result, there are cases where the dimensions of the pattern that is formed undesirably has fluctuation exceeding the tolerance range due to the flare.

DETAILED DESCRIPTION

In general, according to one embodiment, a method for making a correction map of a dose amount of EUV light used when exposing with the EUV light, includes estimating an exposure result based on an initial correction map of the dose amount and flare of the EUV light, determining a goodness of the exposure result, and correcting the initial correction map in the case where the exposure result is unacceptable. And, the correcting of the initial correction map, the estimating of the exposure result, and the determining of the goodness are repeated until the exposure result is good.

In general, according to one embodiment, an exposure method includes correcting a dose amount and irradiating EUV light based on a correction map of the dose amount. The correction map is made by the above mentioned method.

In general, according to one embodiment, a method for manufacturing a semiconductor device includes forming a resist film above a semiconductor substrate, exposing the resist film, forming a resist pattern by developing the resist film, and performing processing of the semiconductor substrate using the resist pattern as a mask. The exposing of the resist film is performed by the above mentioned exposure method.

Embodiments of the invention will now be described with reference to the drawings.

First, a first embodiment will be described.

Figure 1:
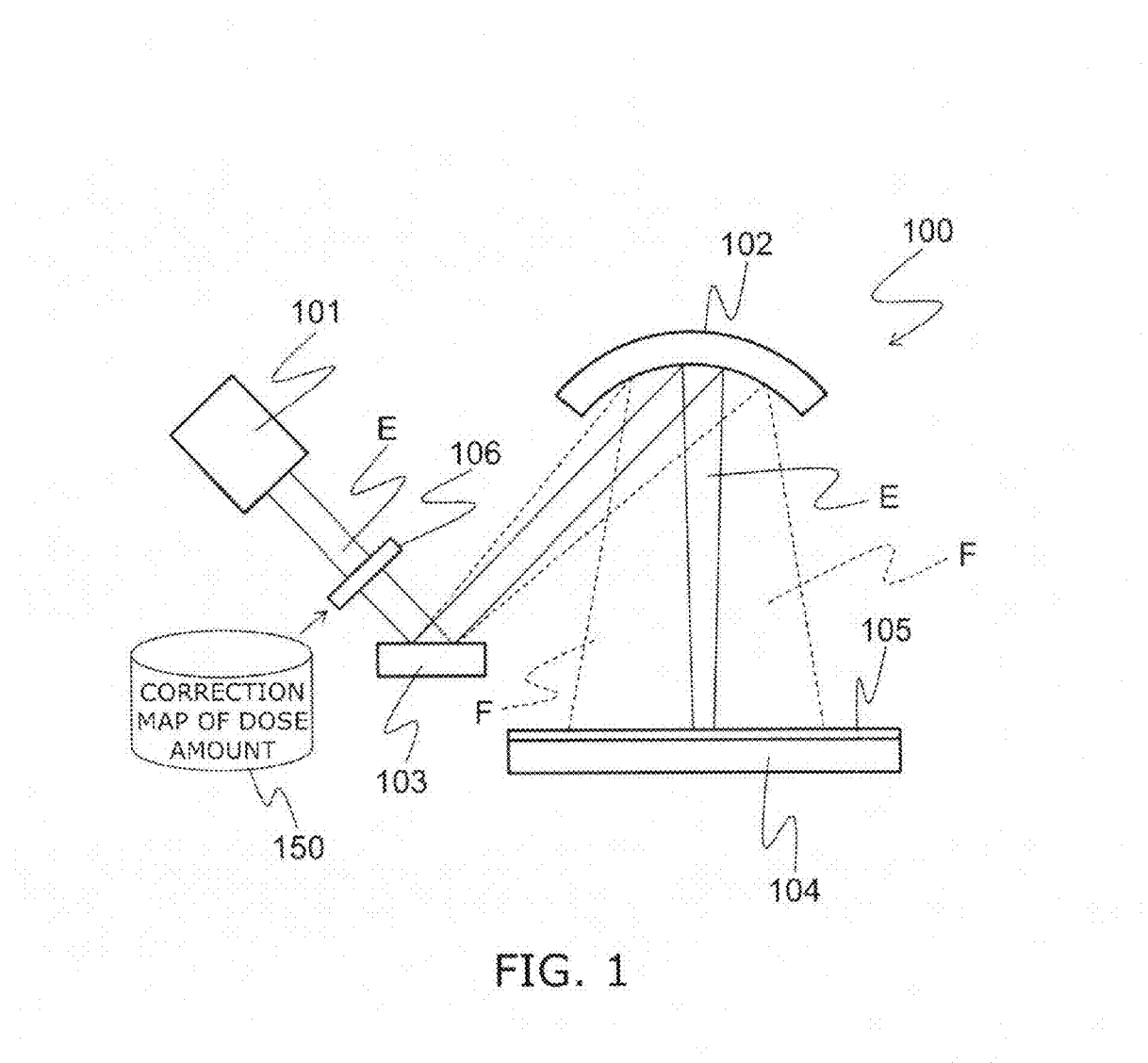
FIG. 1 illustrates an exposure apparatus used in a first embodiment.

FIG. 1 illustrates an exposure apparatus used in the embodiment.

Figure 2:
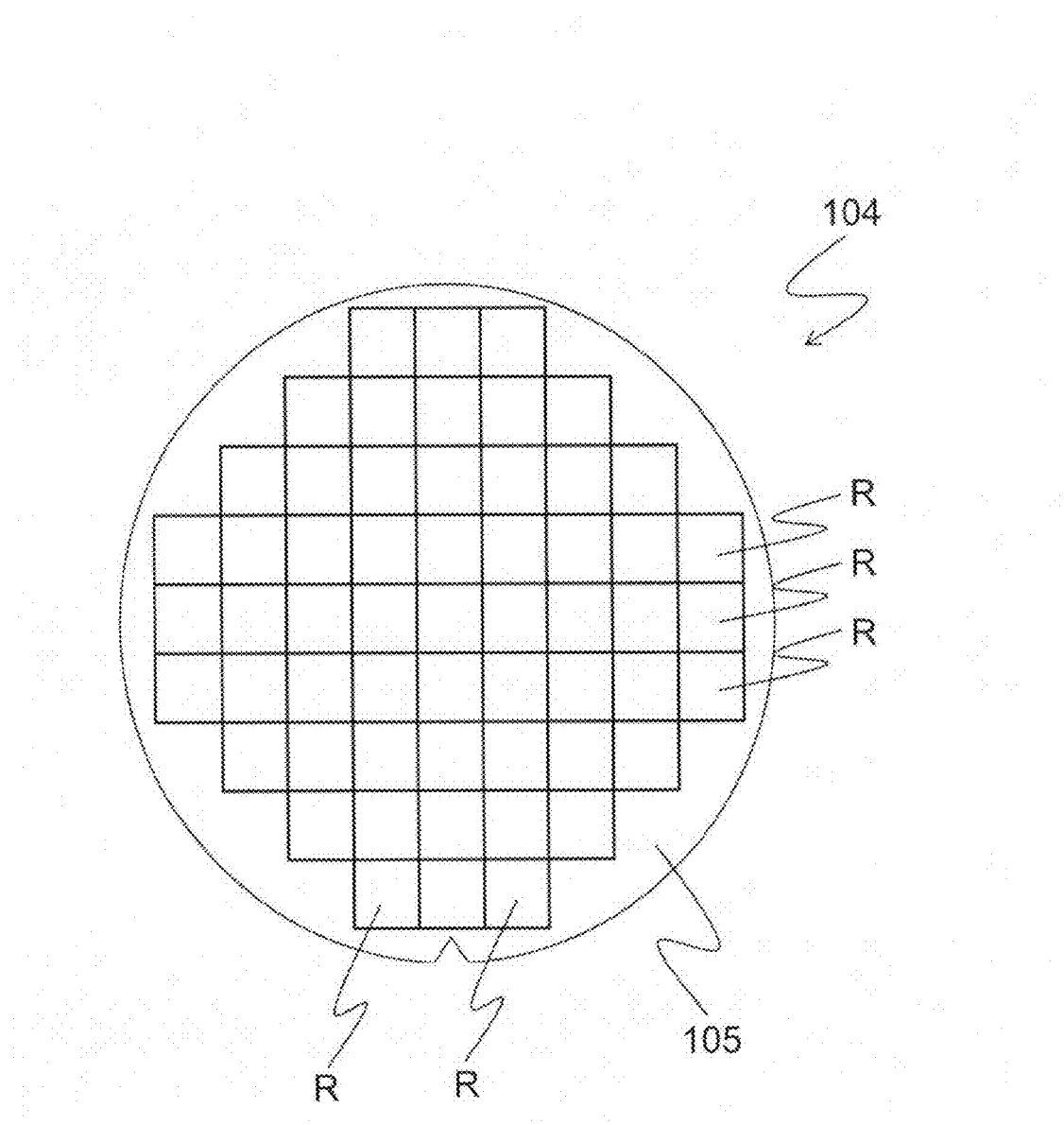
FIG. 2 illustrates a semiconductor substrate used in the first embodiment.

FIG. 2 illustrates a semiconductor substrate used in the embodiment.

The embodiment is an embodiment of a method for making a correction map of a dose amount used when exposing with EUV light, and an exposure method using this correction map. In particular, the embodiment is an embodiment of the case where the flare of a region's own shot is considered.

First, an exposure apparatus used in the exposure method according to the embodiment will be described.

As illustrated in FIG. 1, an EUV light source apparatus 101 that emits EUV light E and a mirror 102 that reflects the EUV light E are provided in an exposure apparatus 100. Other optical components may be provided in the optical system of the exposure apparatus 100. An EUV mask 103 is disposed at a position to reflect the EUV light E output from the EUV light source apparatus 101 toward the mirror 102. A prescribed pattern is formed in the EUV mask 103 to selectively reflect the EUV light. A semiconductor substrate 104 is disposed at a position onto which the EUV light E that is reflected by the mirror 102 is irradiated. For example, the semiconductor substrate 104 may be a silicon wafer itself, may include an insulating film formed on a silicon wafer, and may include a conductive film formed on a silicon wafer. A resist film 105 which is the object to be exposed is formed on the semiconductor substrate 104. The resist film 105 is a film that is exposed when irradiated with the EUV light.

As illustrated in FIG. 2, multiple regions R are set in the semiconductor substrate 104. One or multiple semiconductor devices are manufactured from one region R. For example, the entire semiconductor substrate 104 has a disc configuration; and the configuration of each of the regions R is a rectangle. The regions R are arranged in a chessboard-like configuration to set as many regions R as possible in the semiconductor substrate 104. The EUV light is sequentially irradiated onto the multiple regions R by irradiating the EUV light while changing the relative position of the semiconductor substrate 104 with respect to the optical system of the exposure apparatus 100. Hereinbelow, as viewed from one of the regions R, the irradiation of the EUV light onto the one of the regions R itself is referred to as its "own shot"; and the irradiation of the EUV light onto other regions R is referred to as "other-region shots".

When performing the exposure, the EUV light source apparatus 101 emits the EUV light E. The EUV light E is selectively reflected by the EUV mask 103, is reflected by the mirror 102, and reaches the resist film 105. Thereby, the resist film 105 is selectively exposed with the EUV light E. Here, a dose correction mechanism 106 that corrects the distribution of the dose amount (the light amount) of the EUV light E is disposed in the optical path of the EUV light E emitted from the EUV light source apparatus 101 between the EUV light source apparatus 101 and the EUV mask 103.

In the exposure apparatus 100, fluctuation of the exposure of the resist film 105 occurs due to the nonuniformity of the dose amount of the EUV light E emitted from the EUV light source apparatus 101, the bias of the pattern density of the EUV mask 103, the aberration of the optical system, etc. Also, flare (scattered light) F occurs due to the propagation of the EUV light E through the optical system of the exposure apparatus 100. Thereby, fluctuation of the exposure of the resist film 105 occurs.

Therefore, in the embodiment, a correction map 150 of the dose amount is made; and the exposure apparatus 100 corrects the dose amount of the EUV light E on the EUV mask 103 based on the correction map 150 of the dose amount and then performs the exposure. In other words, the EUV light E incident on the EUV mask 103 is given the desired distribution by changing the configuration of slits included in the dose correction mechanism 106 of the exposure apparatus 100, etc. Thereby, the fluctuation described above is canceled; and the resist film 105 can be exposed such that the desired pattern dimensions are formed.

The method for making the correction map of the dose amount according to the embodiment will now be described.

Figure 3:
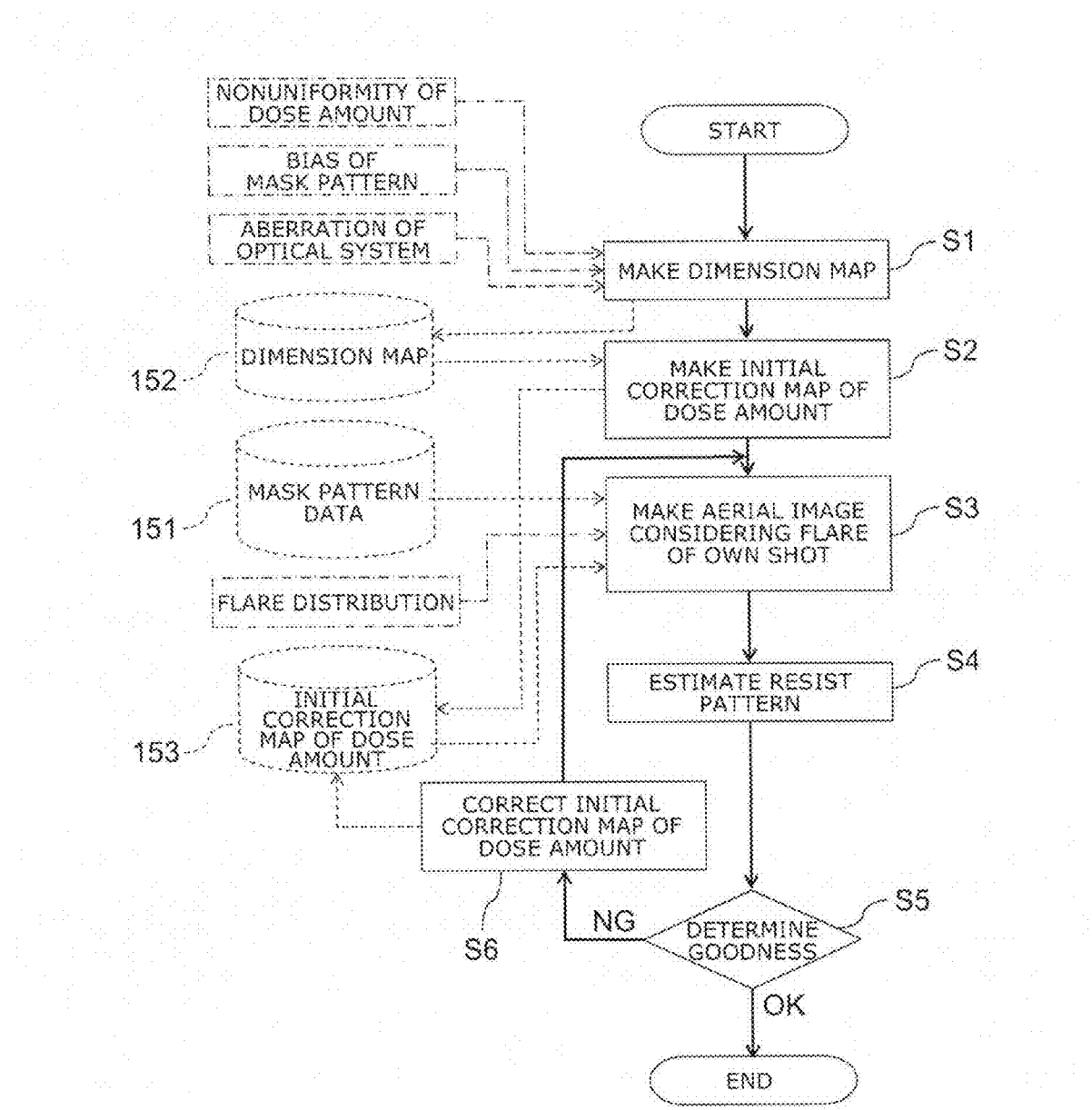
FIG. 3 is a flowchart illustrating a method for making a correction map of a dose amount according to the first embodiment.

FIG. 3 is a flowchart illustrating the method for making the correction map of the dose amount according to the embodiment.

In FIG. 3, the processes that are implemented are illustrated by solid line boxes; the data referred to when implementing the processes and the data made by implementing the processes are illustrated by broken line boxes; and the factors that unavoidably affect the content of the processes are illustrated by single dot-dash line boxes. This also is similar for the other flowcharts described below.

The correction map of the dose amount described below is made each time the combination of the exposure apparatus 100 and the EUV mask 103 changes.

It is a precondition that mask pattern data 151 of the EUV mask 103 exists. Also, effects of the dose amount of the EUV light E emitted by the EUV light source apparatus 101 of the exposure apparatus 100 on the critical dimension of the pattern formed in the resist film 105 are known beforehand. The critical dimension (CD) is the shortest pattern dimension of the pattern to be formed, e.g., the dimension of the pattern downscaled to the limit of the capability of the exposure apparatus 100. Patterns having the critical dimension are formed at many positions inside the region R.

First, as illustrated in step S1 of FIG. 3, a dimension map 152 is made. The dimension map 152 is data of the distribution of the critical dimension inside the region R. Specifically, exposure of one of the regions R of the semiconductor substrate 104 is actually performed; and a resist pattern is formed in the resist film 105 by developing. Then, the critical dimension of the resist pattern is measured; and the measurement result is correlated with the positions inside the region R and recorded. Even in the case where a pattern is formed in the EUV mask 103 such that the critical dimension is uniform, fluctuation of the critical dimension of the resist pattern formed in the resist film 105 that depends on the position occurs due to the fluctuation of the exposure caused by the nonuniformity of the dose amount of the EUV light E emitted from the EUV light source apparatus 101, the bias of the pattern of the EUV mask 103, the aberration of the optical system of the exposure apparatus 100, etc. The dimension map 152 also may be made by measuring the pattern formed in the EUV mask 103 and estimating the critical dimension of the resist pattern based on this measurement result.

Then, as illustrated in step S2, an initial correction map 153 of the dose amount is made such that the critical dimension of the resist pattern formed in the resist film 105 matches the target value by correcting the fluctuation of the critical dimension recorded in the dimension map 152. At this time, the effect of the flare is not considered. Although the flare also fluctuates due to the correction of the dose amount and the exposure result fluctuates further due to the fluctuation of the flare, such fluctuation of the flare caused by the correction of the dose amount is not considered in step S2.

Continuing as illustrated in step S3, an aerial image of the EUV mask 103 to be optically formed at the position of the resist film 105 is made by a calculation in the case where the EUV light E is irradiated onto the EUV mask 103 by applying the initial correction map 153 of the dose amount referring to the initial correction map 153 of the dose amount made in step S2 and the mask pattern data 151 of the EUV mask 103. At this time, the aerial image is made considering the effect of the flare of the region's own shot. In other words, in the case where the EUV light E is irradiated onto some region R, the effect of the flare F irradiated onto this region R is considered.

Generally, the flare distribution can be calculated by Formula 1 recited below. In Formula 1 recited below, (x, y) are spatial coordinates; F(x, y) is a flare distribution function of the intensity of the flare; and M(x, y) is a density function of the pattern formed in the EUV mask 103 and is a function unique to the EUV mask 103. Further, p(x, y) is a point spread function (PSF) of the flare occurring in the optical system of the exposure apparatus 100 and is a function unique to the exposure apparatus 100. Accordingly, the flare distribution function F(x, y) is determined by the combination of the exposure apparatus 100 and the EUV mask 103.

$$F(x,y)=M(x,y)\otimes p(x,y)=\int M(x-\tau,y-\xi)p(\tau,\xi)d\tau d\xi \qquad \text{[Formula 1]}$$

Then, as illustrated in step S4, the pattern (the resist pattern) formed in the resist film 105 is estimated by performing a simulation of the exposing and the developing based on the aerial image made in step S3. Thereby, the exposure result is estimated.

Continuing as illustrated in step S5, the goodness of the exposure result is determined by evaluating whether or not the critical dimension of the resist pattern estimated in step S4 is within the tolerance range. For example, the critical dimension of each portion of the resist pattern is estimated; the difference between the estimated value and the target value is calculated; and the exposure result is determined to be good (OK) if all of the differences are less than the reference value. On the other hand, the exposure result is determined to be unacceptable (NG) if there is a portion where the difference between the target value and the estimated value of the critical dimension is not less than the reference value.

Then, in the case where the exposure result is unacceptable, the flow proceeds to step S6; and the initial correction map 153 of the dose amount is corrected such that the critical dimension of the resist pattern that is formed is within the tolerance range. This correction reflects the effect of the flare of the region's own shot considered in step S3. However, although the flare fluctuates further and the critical dimension of each portion of the resist pattern fluctuates further as the dose amount is corrected in this step, such fluctuation is not considered. Accordingly, the critical dimension of the resist pattern does not always match the target value even when based on the initial correction map 153 after the correction.

After executing step S6, the flow returns to step S3; and the making of the aerial image of step S3, the estimating of the resist pattern of step S4, and the goodness determination of the exposure result of step S5 are implemented again. Then, in the case where the exposure result is unacceptable in the process of step S5, the flow proceeds again to step S6; and the loop made of steps S6, S3, S4, and S5 is repeated. On the other hand, in the case where the exposure result is good in the process of step S5, the process of making the correction map ends; and the initial correction map 153 of this point is used as the correction map 150 of the dose amount (referring to FIG. 1).

Effects of the embodiment will now be described.

In the embodiment as described above, the correction of the initial correction map of the dose amount of step S6, the making of the aerial image of step S3, the estimating of the resist pattern of step S4, and the goodness determination of the exposure result of step S5 are repeated until the exposure result is good. Thereby, the correction of the correction map of the dose amount and the estimation of the exposure result that reflects the fluctuation of the flare caused by the correction are repeated such that the initial correction map gradually approaches an ideal map. As a result, the correction map of the dose amount in which the effect of the flare of the region's own shot is sufficiently reflected can be made.

In the case where the exposure is performed using an ArF beam having a wavelength of 193 nm, it is unnecessary to make the correction map of the dose amount considering the effect of the flare because the effect of the flare is small. Accordingly, normally, the exposure can be performed using the initial correction map 153 as made in step S2 illustrated in FIG. 3 as the correction map 150 of the dose amount. Conversely, in the case where the exposure is performed using an EUV beam having a wavelength of 13.5 nm, the effect of the flare is large. Specifically, compared to the flare when the ArF light is used, the flare when the EUV light is used has an intensity that is greater by a factor of about 100 and a spread that is greater by a factor of about 1000. Therefore, the fluctuation of the exposure cannot be sufficiently corrected using the initial correction map made in step S2. Accordingly, in the embodiment, the correction map 150 that can sufficiently correct the effect of the flare is made by implementing the processes of steps S3 to S6 described above. Thereby, an EUV exposure having little fluctuation can be performed.

A second embodiment will now be described.

Figure 4:
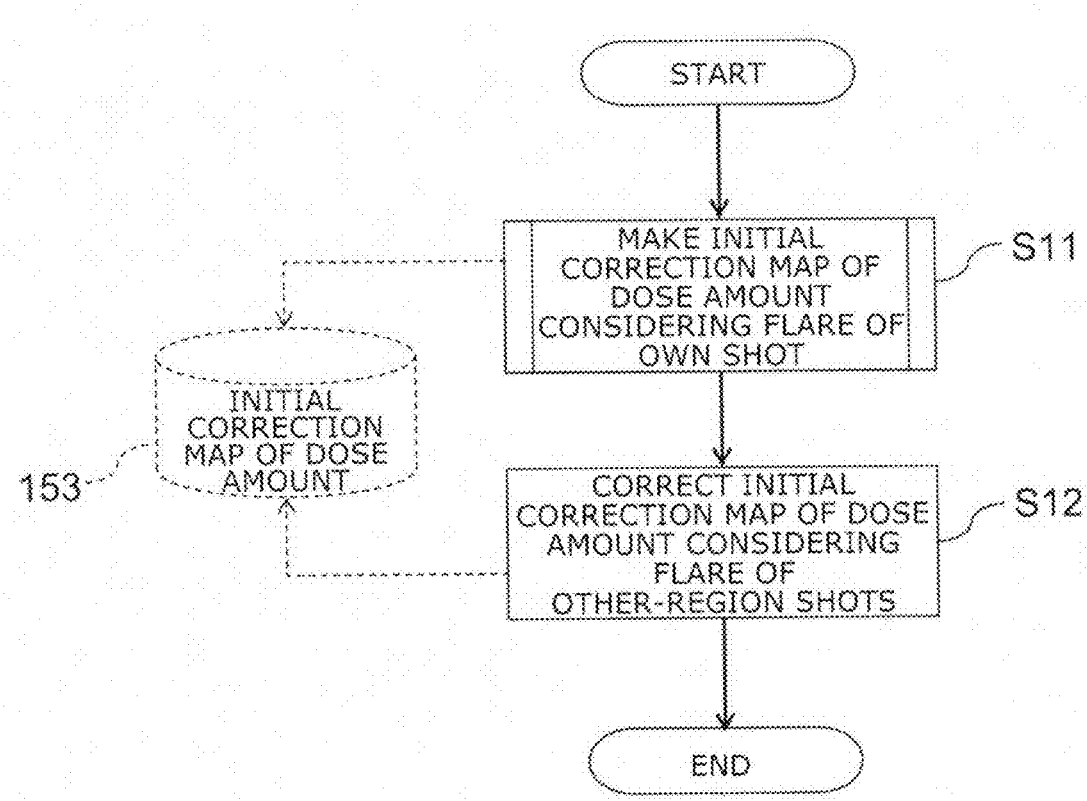
FIG. 4 is a flowchart illustrating a method for making a correction map of a dose amount according to a second embodiment.

FIG. 4 is a flowchart illustrating a method for making the correction map of the dose amount according to the embodiment.

Figure 5A:
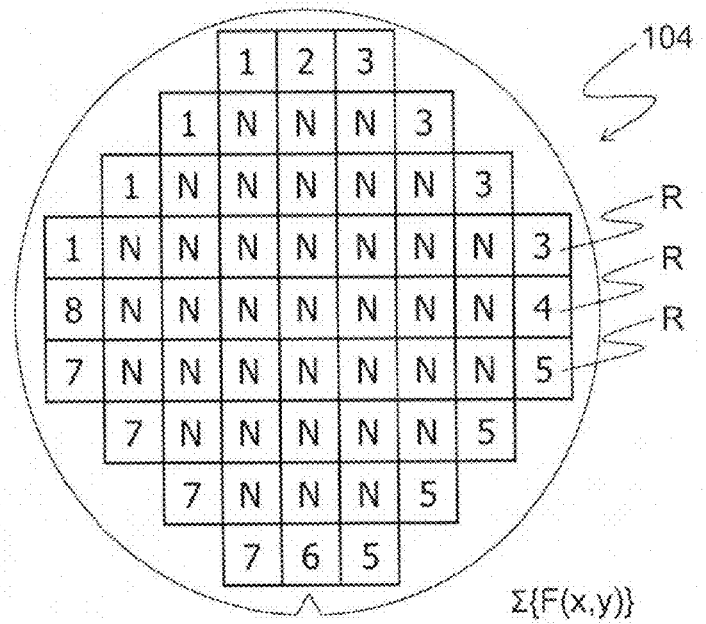
FIG. 5A illustrates a method for classifying the regions of the second embodiment.
Figure 5B:
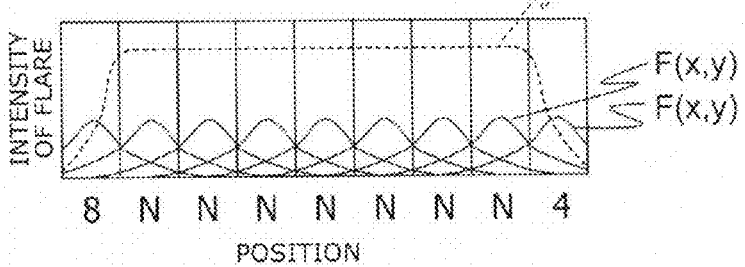
FIG. 5B is a graph illustrating a distribution of a flare, where the horizontal axis illustrates the position on the semiconductor substrate and the vertical axis illustrates the intensity of the flare.
Figure 5C:
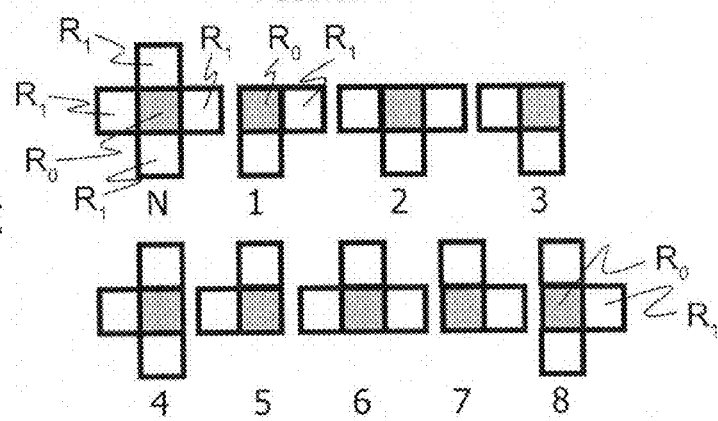
FIG. 5C illustrates the disposition of adjacent regions for the region belonging to each of the groups.

FIG. 5A illustrates a method for classifying the regions of the embodiment; FIG. 5B is a graph illustrating the distribution of the flare, where the horizontal axis illustrates the position on the semiconductor substrate and the vertical axis illustrates the intensity of the flare; and FIG. 5C illustrates the disposition of adjacent regions for the region belonging to each of the groups.

Figure 6A:
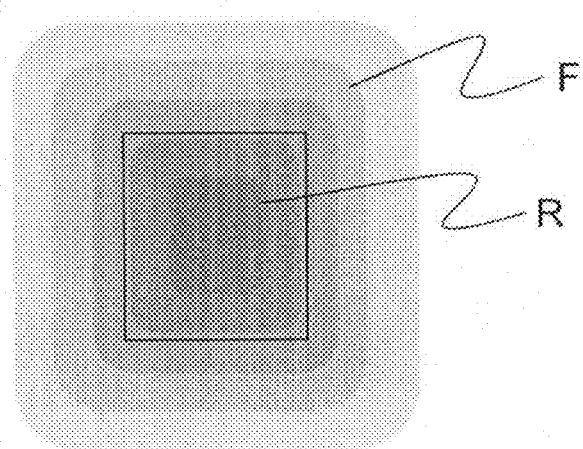
FIG. 6A is a plan view illustrating the flare of the region's own shot.
Figure 6B:
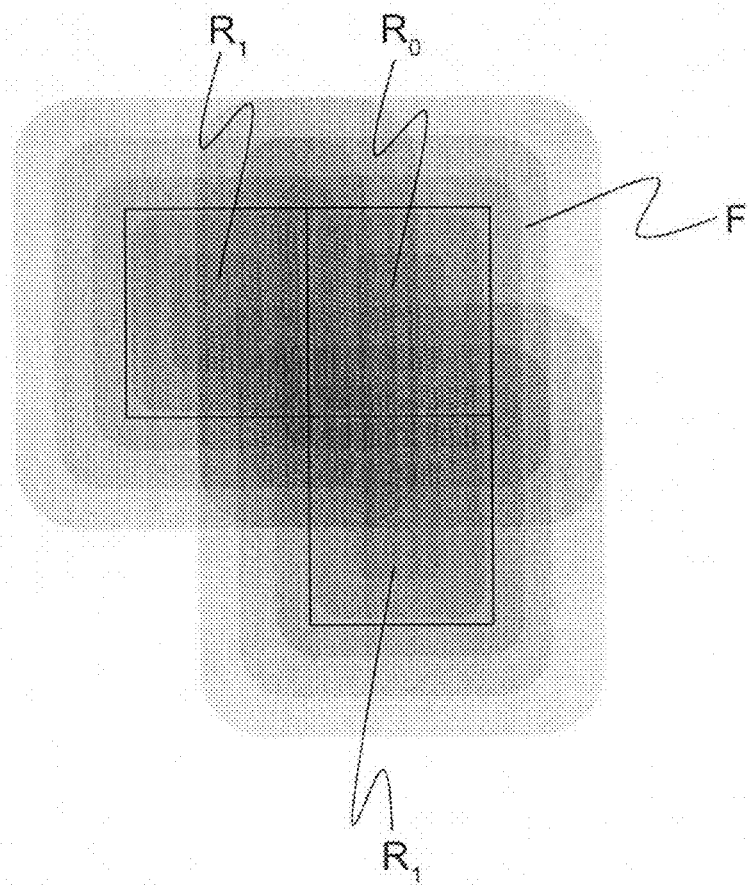
FIG. 6B is a plan view illustrating the flare of its own shot overlaid with the flare of adjacent shots.

FIG. 6A is a plan view illustrating the flare of the region's own shot; and FIG. 6B is a plan view illustrating the flare of its own shot overlaid with the flare of adjacent shots.

The embodiment is an embodiment in which the initial correction map is corrected further considering the flare of the other-region shots after the initial correction map is made considering the flare of the region's own shot using the method according to the first embodiment described above.

The same exposure apparatus 100 (referring to FIG. 1) as that of the first embodiment described above is used in the embodiment.

First, as illustrated in step S11 of FIG. 4, the initial correction map of the dose amount is made considering the flare of the region's own shot. In step S11, the method for making the correction map of the dose amount according to the first embodiment described above, i.e., the method illustrated in FIG. 3, is implemented. Specifically, steps S1 to S4 are executed; and subsequently, steps S6, S3, S4, and S5 are repeatedly implemented until the exposure result is determined to be good in the process of step S5; and when the exposure result is determined to be good, the flow proceeds to step S12. Thereby, as illustrated in FIG. 6A, the initial correction map can be made considering the flare F due to the region's own shot. At this stage, the initial correction map 153 of the dose amount is not used as the correction map 150 (referring to FIG. 1).

Then, as illustrated in step S12 of FIG. 4, the initial correction map 153 of the dose amount is corrected considering the flare of the other-region shots. In other words, as viewed from one region R of interest (called "the object region" herein), the initial correction map 153 is corrected based on the flare F irradiated onto the object region when the EUV light E is irradiated onto other regions R. In the embodiment, a region $R_1$ (called "an adjacent region" herein) adjacent to an object region $R_0$, i.e., the region $R_1$ that shares one side with the object region $R_0$, is considered as the other region onto which the EUV light E is irradiated.

As illustrated in FIG. 5A, when any of the regions R is the object region, the number of the adjacent regions adjacent to this object region is two to four. Then, as illustrated in FIG. 5B and FIG. 6B, the flare of the other-region shots irradiated onto the object region $R_0$ can be approximated by overlaying the flare distribution functions F(x, y) from when the EUV light is irradiated onto each of the adjacent regions $R_1$ for all of the adjacent regions $R_1$.

As illustrated in FIGS. 5A and 5C, each of the regions R that are set in the semiconductor substrate 104 can be classified into nine types of groups by the number and the positions of the adjacent regions $R_1$. In FIGS. 5A to 5C, the regions R belonging to the groups are marked with the reference numerals "N" and "1" to "8." For example, the region R belonging to group "N" has four adjacent regions $R_1$ that contact the region R at the four sides, respectively. When the region R belonging to group "N" is used as the object region $R_0$, the flare of the other-region shots is the total of the flare that is irradiated when the EUV light is irradiated onto each of the four adjacent regions $R_1$. Each of the regions R belonging to groups "1," "3," "5," and "7" has two adjacent regions $R_1$ that contact the region R at two sides, respectively. Each of the regions R belonging to groups "2," "4," "6," and "8" has three adjacent regions $R_1$.

For example, comparing the region R belonging to group "4" with the region R belonging to group "8," the dispositions of the adjacent regions $R_1$ have line symmetry. However, as illustrated in Formula 1 recited above, because the flare distribution function F(x, y) is not always symmetric with respect to x and y, generally, the flare received by the region R belonging to group "4" is different from the flare received by the region R belonging to group "8." Accordingly, it is favorable to discriminate group "4" from group "8." This is similar for group "2" and group "6;" and this is similar for groups "1," "3," "5," and "7." On the other hand, because the flare distribution function F(x, y) is the same for all of the regions R, it can be considered that the regions R belonging to the same group are irradiated with flare having the same distribution; and it is unnecessary to discriminate the regions R of the group from each other. Accordingly, it is sufficient to determine the group to which the object region $R_0$ belongs and correct the initial correction map of the dose amount according to the group. Thereby, as illustrated in FIG. 6B, the initial correction map of the dose amount can be made considering the flare occurring due to the region's own shot and the adjacent shot.

The initial correction map 153 corrected in step S12 of FIG. 4 is used as the correction map 150 of the dose amount. Then, the resist film 105 is exposed by correcting the dose amount and irradiating the EUV light based on the correction map 150 of the dose amount by the method illustrated in FIG. 1.

Effects of the embodiment will now be described.

According to the embodiment, the correction map of the dose amount can be made considering the flare of the adjacent shots in addition to the flare of the region's own shot. As a result, exposure having higher precision is possible. Otherwise, the configuration and the effects of the embodiment are similar to those of the first embodiment described above.

A modification of the second embodiment will now be described.

Figure 7:
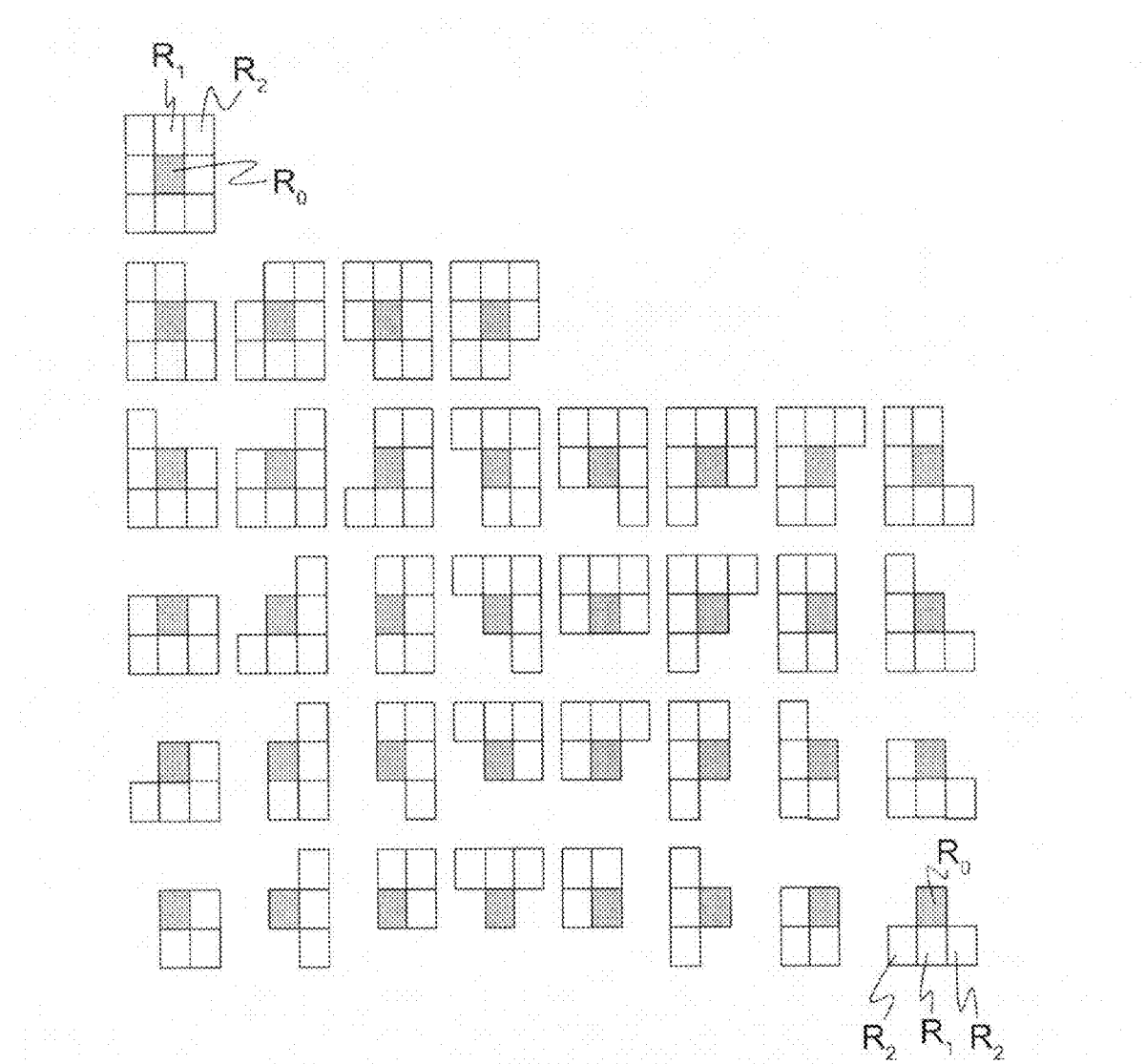
FIG. 7 illustrates a method for classifying the regions and the dispositions of the adjacent regions for the region belonging to each of the groups of a modification of the second embodiment.

FIG. 7 illustrates a method for classifying the regions and the dispositions of the adjacent regions for the region belonging to each of the groups of the modification.

Although only the adjacent regions which are adjacent to the object region are considered as the other regions that irradiate the flare onto the object region when irradiated with the EUV light in the second embodiment described above, in the modification, both the adjacent regions and the diagonal regions are considered as the other regions. Each of the "diagonal regions" is a region disposed at a diagonal position as viewed from the object region and shares one corner with the object region.

As illustrated in FIG. 7, the regions R can be classified into 37 types of groups by the number and the positions of the other regions when the adjacent regions $R_1$ and diagonal regions $R_2$ are considered as the other regions of the object region $R_0$. In particular, there is one type in the case where there are eight other regions, that is, in the case where the entire periphery is surrounded with the other regions; there are four types in the case where there are seven other regions; and there are eight types in the case where there are six to three other regions. In this modification, the object region $R_0$ is determined to belong to one of these 37 types of groups; and the initial correction map of the dose amount is corrected according to this group. Thereby, the effect of the flare irradiated from the diagonal regions also can be considered; and a correction map of the dose amount having higher precision can be made. Otherwise, the configuration and the effects of this modification are similar to those of the second embodiment described above.

The other regions may include a region R that is two or more regions away from the object region $R_0$, i.e., a region R disposed at a position having one or more regions R between the object region $R_0$ and this region R. For example, if there is sufficient calculation capacity, all of the regions R set in the semiconductor substrate 104 except for the object region $R_0$ may be included in the other regions.

A third embodiment will now be described.

Figure 8:
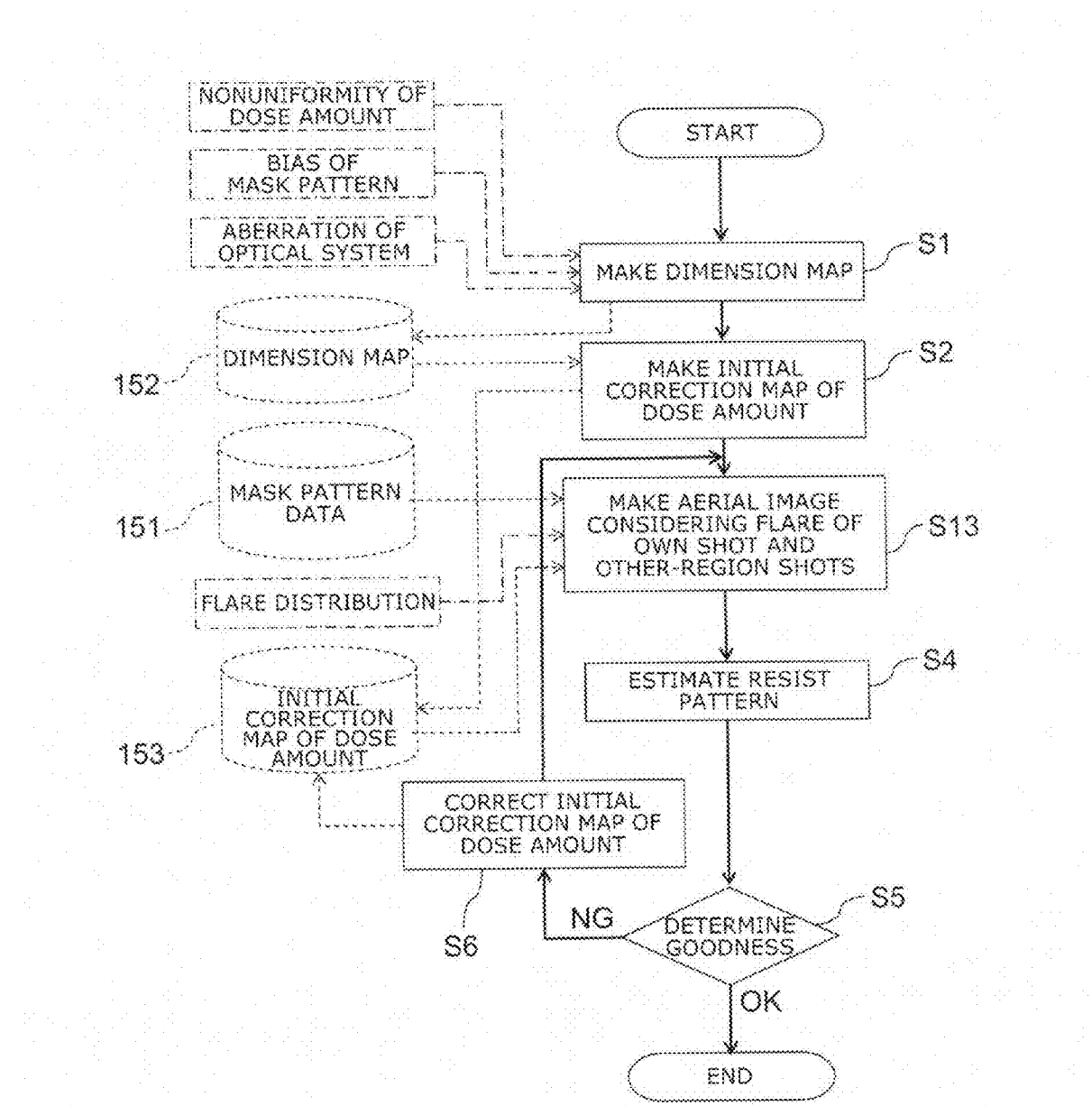
FIG. 8 is a flowchart illustrating a method for making the correction map of the dose amount according to a third embodiment.

FIG. 8 is a flowchart illustrating a method for making the correction map of the dose amount according to the embodiment.

Figure 9:
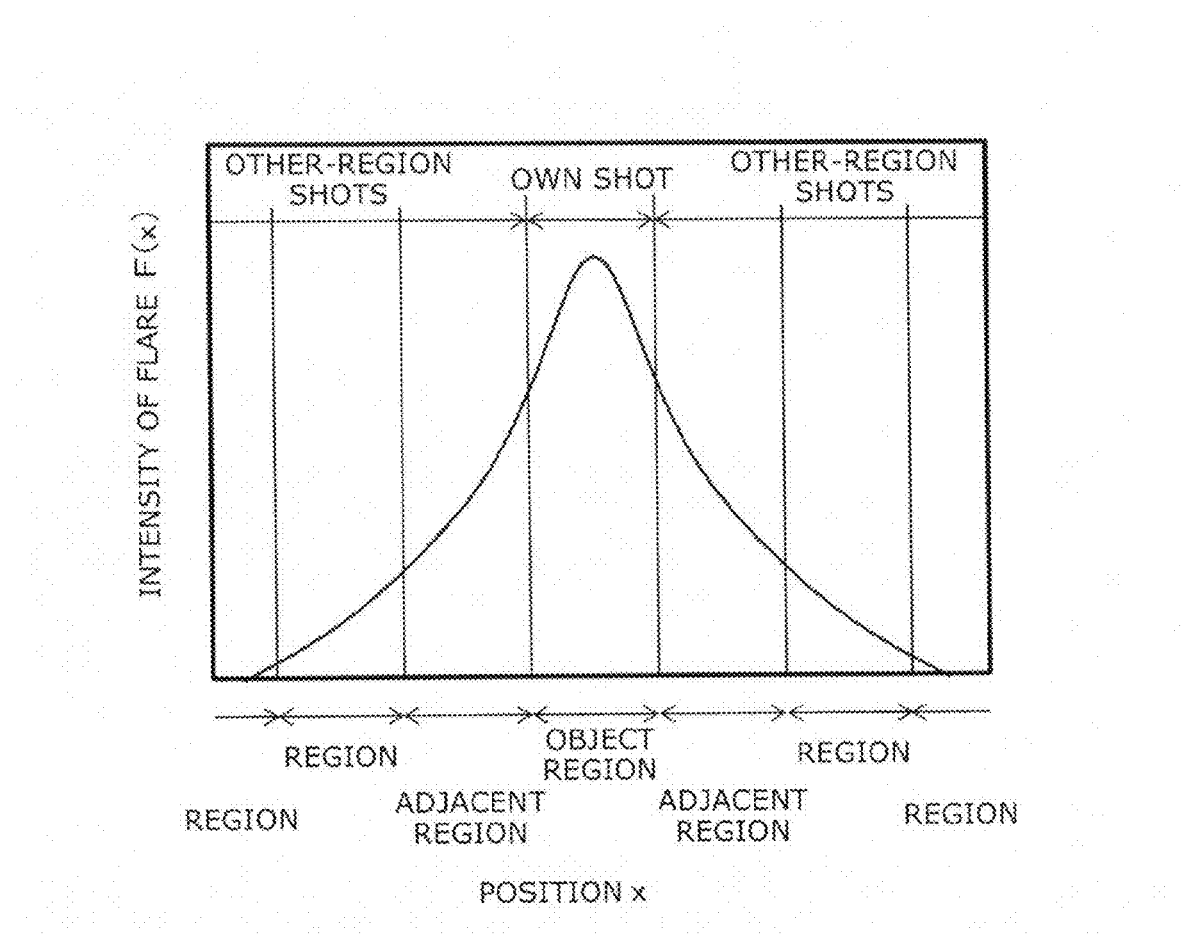
FIG. 9 is a graph illustrating the flare distribution function, where the horizontal axis illustrates the position and the vertical axis illustrates the intensity of the flare.

FIG. 9 is a graph illustrating the flare distribution function, where the horizontal axis illustrates the position and the vertical axis illustrates the intensity of the flare.

The embodiment is an embodiment in which the initial correction map is made considering the region's own shot and the other-region shots using the method for making the correction map of the dose amount according to the first embodiment described above.

In the embodiment as well, the same exposure apparatus 100 (referring to FIG. 1) as that of the first embodiment described above is used.

As illustrated in FIG. 8, the method for making the correction map according to the embodiment differs from the method for making the correction map according to the first embodiment described above (referring to FIG. 3) in that step S13 is provided instead of step S3 (referring to FIG. 3). In step S13, the aerial image of the EUV mask 103 (referring to FIG. 1) is made considering the flare of the other-region shots in addition to the flare of the region's own shot.

As illustrated in FIG. 9, the flare F that occurs when the EUV light is irradiated onto one of the regions R is irradiated not only onto the region irradiated with the EUV light but also onto the other regions R disposed proximally to the one of the regions R. Further, as described above, the intensity of the flare at a position (x, y) has the flare distribution function F(x, y). Therefore, in the case where the flare of its own shot is calculated, the portion of the flare distribution function F(x, y) corresponding to the region R onto which the EUV light is irradiated is used. On the other hand, in the case where the flare of the other-region shots is calculated, the portions of the flare distribution function F(x, y) corresponding to the other regions are used. For example, the flare of the adjacent shots can be calculated if the portions of the flare distribution function F(x, y) corresponding to the adjacent regions are used. Then, the flare distribution of the total of the flare of its own shot and the flare of the adjacent shots can be calculated by shifting the portions of the flare distribution function F(x, y) corresponding to the adjacent regions by a distance corresponding to the width of the region R and by overlaying the portions corresponding to the adjacent regions onto the portion corresponding to the region R onto which the EUV light is irradiated.

Thus, by folding up the flare distribution function F(x, y), the aerial image can be made considering both the flare of the region's own shot and the flare of the other-region shots. In such a case, the combination of the overlaid portions of the flare distribution function F(x, y) can be determined by the group classifications illustrated in FIG. 5C or FIG. 7. In other words, in the case where only the flare of the adjacent regions is considered, it is sufficient to classify the object regions into nine types of groups as illustrated in FIG. 5C. In the case where the flare of the adjacent regions and the diagonal regions is considered, it is sufficient to classify the object regions into 37 types of groups as illustrated in FIG. 7.

In the embodiment, similarly to the first embodiment described above, the process of step S13 described above is embedded in the loop of estimating the exposure result (steps S13 and S4), determining the goodness of the exposure result (step S5), and correcting the initial correction map of the dose amount (step S6); and this is repeatedly executed until it is determined that the exposure result is good in step S5. Then, the process ends at the stage at which the exposure result is determined to be good in step S5; and the initial correction map 153 of the dose amount is used as the correction map 150 (referring to FIG. 1). Thereby, a correction map of the dose amount that reflects both the flare of the region's own shot and the flare of the other-region shots can be made.

Effects of the embodiment will now be described.

According to the embodiment, the calculation of the flare of the other-region shots is embedded in the loop of correcting the initial correction map of the dose amount, estimating the exposure result, and determining the goodness of the exposure result. Thereby, compared to the second embodiment described above, the correction map can more effectively reflect the effect of the flare of the other-region shots. On the other hand, according to the second embodiment described above, the correction map can be made more efficiently because the calculation amount per loop can be reduced. Otherwise, the configuration and the effects of the embodiment are similar to those of the second embodiment described above.

A fourth embodiment will now be described.

FIGS. 10A to 10E are cross-sectional views of processes, illustrating a method for manufacturing a semiconductor device according to the embodiment.

The embodiment manufactures a semiconductor device by the exposure method according to one selected from the embodiments and the modifications of the embodiments described above.

Figure 10A:
FIGS. 10A to 10E are cross-sectional views of processes, illustrating a method for manufacturing a semiconductor device according to a forth embodiment.

First, as illustrated in FIG. 10A, the semiconductor substrate 104 is prepared. The configuration of the semiconductor substrate 104 is not particularly limited and may be a silicon wafer itself, may include an insulating film formed on a silicon wafer, and may include a conductive film formed on a silicon wafer.

Figure 10B:
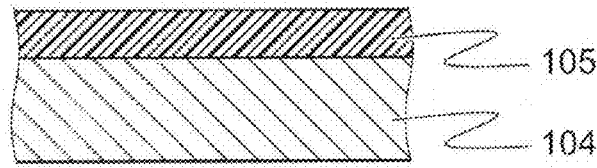

Then, as illustrated in FIG. 10B, the resist film 105 is formed on the semiconductor substrate 104. The resist film 105 is formed of a material that is exposed when irradiated with the EUV light.

Figure 10C:
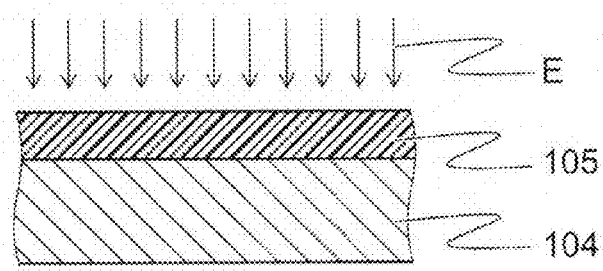

Continuing as illustrated in FIG. 10C, the resist film 105 is exposed by irradiating the EUV light E onto the resist film 105. This exposure is performed by the method described in the first embodiment, the second embodiment, the modification of the second embodiment, or the third embodiment described above. In other words, the resist film 105 is exposed by correcting the dose amount to reduce the effect of the flare based on the correction map 150 (referring to FIG. 1) of the dose amount and by irradiating the EUV light.

Figure 10D:
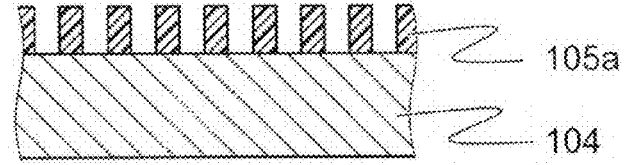

Then, as illustrated in FIG. 10D, a resist pattern 105a is formed by selectively removing the resist film 105 by developing the resist film 105 after the exposure.

Figure 10E:
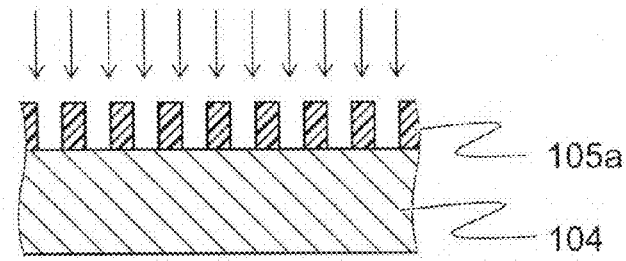

Continuing as illustrated in FIG. 10E, processing of the semiconductor substrate 104 is performed using the resist pattern 105a as a mask. The content of the processing is not particularly limited. For example, in the case where the semiconductor substrate 104 is the silicon wafer itself, trenches may be made in the silicon wafer by performing etching using the resist pattern 105a as a mask; and impurity diffusion regions may be formed by performing ion implantation of an impurity using the resist pattern 105a as a mask. In the case where the semiconductor substrate 104 includes the insulating film formed on the silicon wafer, trenches or holes may be made in the insulating film by performing etching using the resist pattern 105a as a mask. In the case where the semiconductor substrate 104 includes the conductive film formed on the silicon wafer, the conductive film may be patterned into an interconnect configuration by performing etching using the resist pattern 105a as a mask. The semiconductor device is manufactured by such processing.

According to the embodiment, EUV light can be utilized; and the resist film 105 can be exposed with high precision by reducing the effect of the flare when performing the exposure. Thereby, a fine resist pattern 105a can be formed; and fine patterning can be performed. For example, the width and the spacing of the interconnects can be downscaled while controlling the width of the interconnects with high precision. As a result, a semiconductor device having high integration can be manufactured.

According to the embodiments described above, a method for making a correction map of a dose amount, an exposure method, and a method for manufacturing a semiconductor device that can reduce the effect of flare can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A method for making a correction map of a dose amount, the dose amount being a dose amount of EUV light used when exposing with the EUV light, the exposing being performed by sequentially irradiating the EUV light onto a plurality of regions, the method comprising:

making an initial correction map of the dose amount by considering at least one selected from the group consisting of a nonuniformity of a dose amount of EUV light emitted from a light source, a bias of a pattern of an EUV mask, and fluctuation of exposing by an exposure apparatus, but not considering a flare of the EUV light;

calculating, using a processor programmed to perform the calculating, an aerial image of the EUV mask to be optically formed at a position of a resist film based on the initial correction map of the dose amount and flare irradiated onto one of the regions when the EUV light is irradiated onto the one of the regions;

estimating a pattern formed in the resist film by performing a simulation of the exposing and a developing based on the aerial image;

determining whether or not all of differences between estimated values and target values of critical dimensions of portions of the estimated pattern are less than reference values; and correcting the initial correction map in the case where at least one of the differences is more than the reference value, the correcting of the initial correction map, the calculating of the aerial image, the estimating of the pattern, and the determining being repeated until all of the differences are less than the reference value.

2. The method according to claim 1, further comprising correcting the initial correction map based on flare irradiated onto the one of the regions when the EUV light is irradiated onto one other region of the plurality of regions after all of the differences become less than the reference value.

3. The method according to claim 2, wherein a configuration of each of the regions is a rectangle, and the one other region is a region contacting the one of the regions.

4. The method according to claim 2, wherein a configuration of each of the regions is a rectangle, and the one other region includes a region contacting the one of the regions and a region disposed at a diagonal position as viewed from the one of the regions.

5. The method according to claim 2, wherein the correcting of the initial correction map based on the flare irradiated onto the one of the regions when the EUV light is irradiated onto the one other region includes pre-classifying the plurality of regions into a plurality of groups based on a disposition of the one other region with respect to the one of the regions and includes considering the flare according to the group of the one of the regions.

6. A method for making a correction map of a dose amount, the dose amount being a dose amount of EUV light used when exposing with the EUV light, the exposing being performed by sequentially irradiating the EUV light onto a plurality of regions, the method comprising:

making an initial correction map of the dose amount by considering at least one selected from the group consisting of a nonuniformity of a dose amount of EUV light emitted from a light source, a bias of a pattern of an EUV mask, and fluctuation of exposing by an exposure apparatus, but not considering a flare of the EUV light;

calculating, using a processor programmed to perform the calculating, an aerial image of the EUV mask to be optically formed at a position of a resist film based on the initial correction map of the dose amount and both flare irradiated onto one of the regions when the EUV light is irradiated onto the one of the regions and flare irradiated onto the one of the regions when the EUV light is irradiated onto one other region of the plurality of regions;

estimating a pattern formed in the resist film by performing a simulation of the exposing and a developing based on the aerial image;

determining whether or not all of differences between estimated values and target values of critical dimensions of portions of the estimated pattern are less than reference values; and correcting the initial correction map in the case where at least one of the differences is more than the reference value, the correcting of the initial correction map, the calculating of the aerial image, the estimating of the pattern, and the determining being repeated until all of the differences are less than the reference value.

7. The method according to claim 6, wherein a configuration of each of the regions is a rectangle, and the one other region is a region contacting the one of the regions.

8. The method according to claim 6, wherein a configuration of each of the regions is a rectangle, and the one other region includes a region contacting the one of the regions and a region disposed at a diagonal position as viewed from the one of the regions.

9. The method according to claim 6, wherein
    the calculating of the aerial image includes pre-classifying the plurality of regions into a plurality of groups based on a disposition of the one other region with respect to the one of the regions and includes considering the flare according to the group of the one of the regions.

10. An exposure method including correcting a dose amount and irradiating EUV light based on a correction map of the dose amount,
    the exposing being performed by sequentially irradiating the EUV light onto a plurality of regions,
    the correction map being made by:
        making an initial correction map of the dose amount by considering at least one selected from the group consisting of a nonuniformity of a dose amount of EUV light emitted from a light source, a bias of a pattern of an EUV mask, and fluctuation of exposing by an exposure apparatus, but not considering a flare of the EUV light;

calculating, using a processor programmed to perform the calculating, an aerial image of the EUV mask to be optically formed at a position of a resist film based on the initial correction map of the dose amount and flare irradiated onto one of the regions when the EUV light is irradiated onto at least the one of the regions;

estimating a pattern formed in the resist film by performing a simulation of the exposing and a developing based on the aerial image;

determining whether or not all of differences between estimated values and target values of critical dimensions of portions of the estimated pattern are less than reference values; and correcting the initial correction map in the case where at least one of the differences is more than the reference value, repeating the correcting of the initial correction map, the calculating of the aerial image, the estimating of the pattern, and the determining until all of the differences are less than the reference value.

11. A method for manufacturing a semiconductor device, comprising:
    forming a resist film above a semiconductor substrate;
    exposing the resist film;
    forming a resist pattern by developing the resist film; and
    performing processing of the semiconductor substrate using the resist pattern as a mask,
    the exposing of the resist film being performed by sequentially irradiating EUV light onto a plurality of regions and correcting a dose amount based on a correction map of the dose amount,
    the correction map being made by:
        making an initial correction map of the dose amount by considering at least one selected from the group consisting of a nonuniformity of a dose amount of EUV light emitted from a light source, a bias of a pattern of an EUV mask, and fluctuation of exposing by an exposure apparatus, but not considering a flare of the EUV light;

calculating, using a processor programmed to perform the calculating, an aerial image of the EUV mask to be optically formed at a position of a resist film based on the initial correction map of the dose amount and flare irradiated onto one of the regions when the EUV light is irradiated onto at least the one of the regions;

estimating a pattern formed in the resist film by performing a simulation of the exposing and a developing based on the aerial image;

determining whether or not all of differences between estimated values and target values of critical dimensions of portions of the estimated pattern are less than reference values; and correcting the initial correction map in the case where at least one of the differences is more than the reference value, repeating the correcting of the initial correction map, the calculating of the aerial image, the estimating of the pattern, and the determining until all of the differences are less than the reference value.

12. The method according to claim 11, wherein the initial correction map is corrected further based on flare irradiated onto the one of the regions when the EUV light is irradiated onto one other region of the plurality of regions after all of the differences become less than the reference value.

13. The method according to claim 12, wherein a configuration of each of the regions is a rectangle, and the one other region is a region contacting the one of the regions.

14. The method according to claim 12, wherein a configuration of each of the regions is a rectangle, and the one other region includes a region contacting the one of the regions and a region disposed at a diagonal position as viewed from the one of the regions.

15. A method for manufacturing a semiconductor device, comprising:
   forming a resist film above a semiconductor substrate;
   exposing the resist film;
   forming a resist pattern by developing the resist film; and
   performing processing of the semiconductor substrate using the resist pattern as a mask,
   the exposing of the resist film being performed by sequentially irradiating EUV light onto a plurality of regions and correcting a dose amount based on a correction map of the dose amount,
   the correction map being made by:
      making an initial correction map of the dose amount by considering at least one selected from the group consisting of a nonuniformity of a dose amount of EUV light emitted from a light source, a bias of a pattern of an EUV mask, and fluctuation of exposing by an exposure apparatus, but not considering a flare of the EUV light;
      calculating, using a processor programmed to perform the calculating, an aerial image of the EUV mask to be optically formed at a position of a resist film based on the initial correction map of the dose amount and both flare irradiated onto one of the regions when the EUV light is irradiated onto the one of the regions and flare irradiated onto the one of the regions when the EUV light is irradiated onto one other region of the plurality of regions;
      estimating a pattern formed in the resist film by performing a simulation of the exposing and a developing based on the aerial image;
      determining whether or not all of differences between estimated values and target values of critical dimensions of portions of the estimated pattern are less than reference values; and
      correcting the initial correction map in the case where at least one of the differences is more than the reference value,
   repeating the correcting of the initial correction map, the calculating of the aerial image, the estimating of the pattern, and the determining until all of the differences are less than the reference value.

* * * * *